United States Patent
Barnes et al.

(10) Patent No.: US 6,521,546 B1
(45) Date of Patent: Feb. 18, 2003

(54) METHOD OF MAKING A FLUORO-ORGANOSILICATE LAYER

(75) Inventors: Michael Barnes, San Ramon, CA (US); Hichem M'Saad, Santa Clara, CA (US); Huong Thanh Nguyen, San Ramon, CA (US); Farhad Moghadam, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/593,851

(22) Filed: Jun. 14, 2000

(51) Int. Cl.$^7$ .............................................. H01L 21/31
(52) U.S. Cl. .................. 438/778; 438/780; 438/783; 438/784; 438/786; 438/787; 438/788; 438/789; 438/790; 438/637; 438/638
(58) Field of Search ................. 438/778, 780, 438/783, 784, 786, 787, 788, 789, 790, 637, 638

(56) References Cited

U.S. PATENT DOCUMENTS

| | | | |
|---|---|---|---|
| 4,634,601 A | 1/1987 | Hamakawa et al. | 427/39 |
| 4,894,352 A | 1/1990 | Lane et al. | 437/238 |
| 6,060,132 A | 5/2000 | Lee | 427/579 |
| 6,068,884 A | 5/2000 | Rose et al. | 427/255.6 |
| 6,107,184 A * | 8/2000 | Mandal et al. | 438/623 |
| 6,147,009 A | 11/2000 | Grill et al. | 438/780 |
| 6,171,945 B1 * | 1/2001 | Mandal et al. | 438/790 |
| 6,245,690 B1 * | 6/2001 | Yau et al. | 438/780 |
| 6,287,990 B1 * | 9/2001 | Cheung et al. | 438/780 |
| 6,303,523 B2 * | 10/2001 | Cheung et al. | 438/780 |
| 6,312,793 B1 | 11/2001 | Grill et al. | 428/312.6 |
| 6,348,725 B2 | 2/2002 | Cheung et al. | 257/642 |
| 2001/0005546 A1 * | 6/2001 | Cheung et al. | 428/210 |
| 2002/0045361 A1 * | 4/2002 | Cheung et al. | 438/790 |

FOREIGN PATENT DOCUMENTS

| | | | |
|---|---|---|---|
| EP | 0826791 A2 | 3/1998 | C23C/16/40 |
| WO | WO 99/21706 | 5/1999 | B32B/9/04 |

* cited by examiner

*Primary Examiner*—John F. Niebling
*Assistant Examiner*—Lynne A. Gurley
(74) *Attorney, Agent, or Firm*—Moser, Patterson & Sheridan

(57) ABSTRACT

A method of forming an integrated circuit using a fluoro-organosilicate layer is disclosed. The fluoro-organosilicate layer is formed by applying an electric field to a gas mixture comprising a fluoro-organosilane compound and an oxidizing gas. The fluoro-organosilicate layer is compatible with integrated circuit fabrication processes. In one integrated circuit fabrication process, the fluoro-organosilicate layer is used as a hardmask. In another integrated circuit fabrication process, the fluoro-organosilicate layer is incorporated into a damascene structure.

39 Claims, 4 Drawing Sheets

METHOD OF MAKING A FLUORO-ORGANOSILICATE LAYER

BACKGROUND OF THE DISCLOSURE

1. Field of the Invention

The present invention relates to dielectric materials, their use in integrated circuit fabrication, and a method for forming a dielectric material.

2. Description of the Background Art

Integrated circuits have evolved into complex devices that can include millions of components (e. g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e. g., sub-micron dimensions), the materials used to fabricate such components contribute to their electrical performance. For example, low resistivity metal interconnects (e. g., copper and aluminum) provide conductive paths between the components on integrated circuits. Typically, the metal interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e. g., dielectric constants less than about 4.5) are needed.

Organosilicates have been suggested for use as an insulating material on integrated circuits, since some organosilicates have low dielectric constants. However, organosilicates can absorb water, due to their hydrogen content, which makes them unsuitable as a moisture barrier for integrated circuits. Additionally, organosilicates suffer from etch compatibility and porosity as compared to standard oxide films such as, for example, undoped silicon oxides and fluorosilicate glass (FSG).

Therefore, a need exists in the art for low dielectric constant materials, which are also good moisture barriers for integrated circuits.

SUMMARY OF THE INVENTION

In one embodiment, a method for forming a fluoro-organosilicate layer for use in integrated circuit fabrication is provided. In one aspect, the fluoro-organosilicate layer is formed by applying an electric field to a gas mixture comprising a fluoro-organosilane compound and an oxidizing gas. The gas mixture is introduced into a process chamber where the application of the electric field thereto, in close proximity to a substrate surface, results in the formation of the fluoro-organosilicate layer on the substrate surface.

An as-deposited fluoro-organosilicate layer has a dielectric constant that is less than about 3.5, making it suitable for use as an insulating material on integrated circuits. The dielectric constant of the fluoro-organosilicate layer is tunable, in that it can be varied in the desired range as a function of the reaction temperature and composition of the gas mixture during layer formation. Also, the fluorine content of the fluoro-organosilicate layer reduces the water absorption capability thereof, making such fluoro-organosilicate layers suitable as moisture barriers for integrated circuits.

The fluoro-organosilicate layer is compatible with integrated circuit fabrication processes. In one integrated circuit fabrication process, the fluoro-organosilicate layer is used as a hardmask. For such an embodiment, a preferred process sequence includes depositing a fluoro-organosilicate layer on a substrate. After the fluoro-organosilicate layer is deposited on the substrate, a pattern is defined therein. Thereafter, the pattern is transferred into the substrate using the fluoro-organosilicate layer as a hardmask.

In another integrated circuit fabrication process, the fluoro-organosilicate layer is incorporated into a damascene structure. For such an embodiment, a preferred process sequence includes depositing a first dielectric layer on a substrate. A fluoro-organosilicate layer is then formed on the first dielectric layer. Thereafter, the fluoro-organosilicate layer is patterned and etched to define contacts/vias therethrough. After the fluoro-organosilicate layer is patterned and etched, a second dielectric layer is deposited thereover. The second dielectric layer is then patterned and etched to define interconnects therethrough. The interconnects formed in the second dielectric layer are positioned over the contacts/vias formed in the fluoro-organosilicate layer. After the interconnects are formed the contacts/vias defined in the fluoro-organosilicate layer are etched through the first dielectric layer to the substrate surface. Thereafter, the damascene structure is completed by filling the interconnects and contacts/vias with a conductive material.

BRIEF DESCRIPTION OF THE DRAWINGS

The teachings of the present invention can be readily understood by considering the following detailed description in conjunction with the accompanying drawings, in which.

DETAILED DESCRIPTION

Figure 1A:
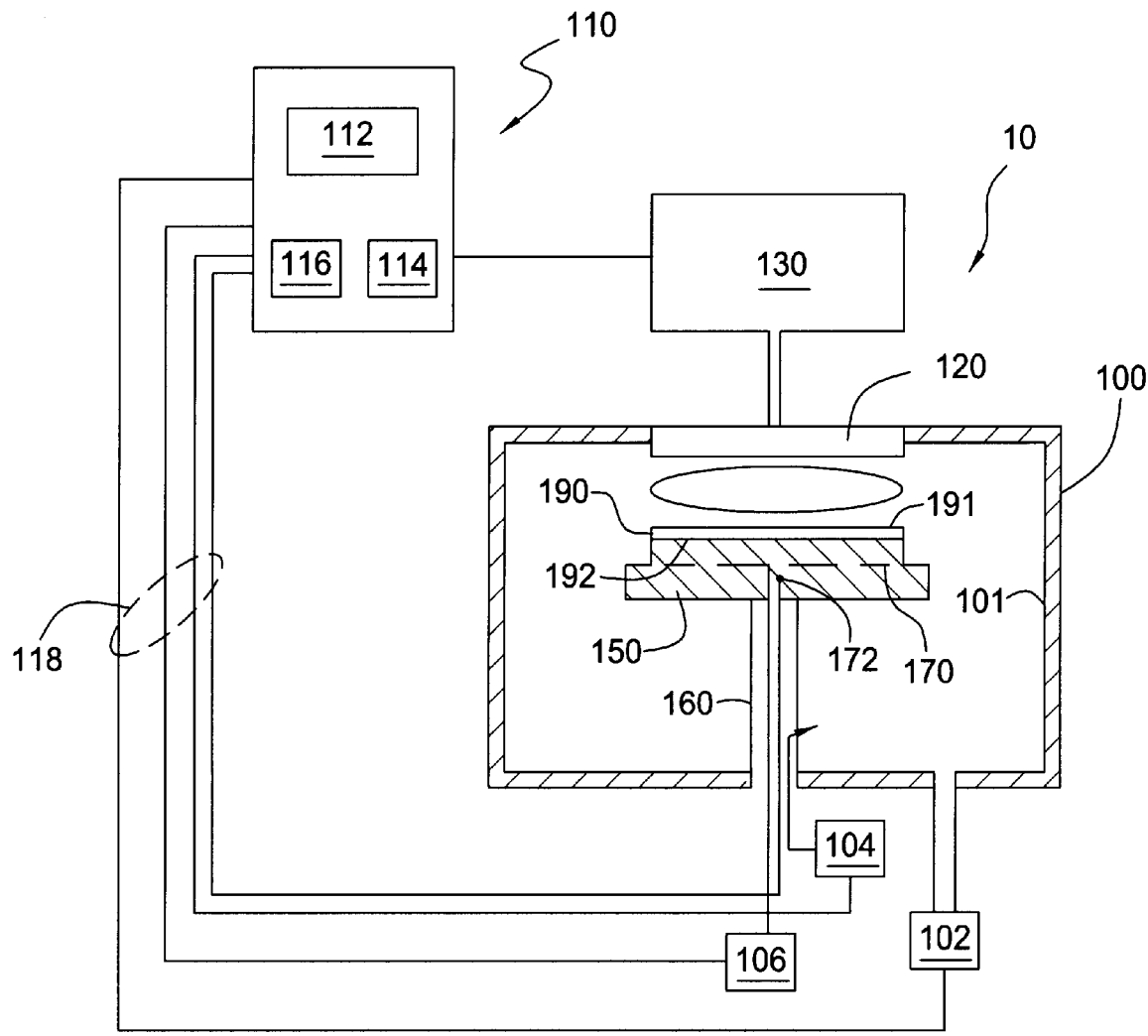
FIGS. 1A–1B depict a schematic illustration of an apparatus that can be used for the practice of embodiments described herein.

FIG. 1A is a schematic representation of a wafer processing system 10 that can be used to perform fluoro-organosilicate layer formation in accordance with embodiments described herein. System 10 typically comprises a process chamber 100, a gas panel 130, a control unit 110, along with other hardware components such as power supplies and vacuum pumps. Details of the system 10 used in the present invention are described in commonly assigned U.S. patent application Ser. No. 09/211,998, entitled "High Temperature Chemical Vapor Deposition Chamber", filed on Dec. 14, 1998, and is herein incorporated by reference. The salient features of this system 10 are briefly described below. Examples of system 10 include plasma enhanced chemical vapor deposition (PECVD) chambers as well as subatmospheric chemical vapor deposition (SACVD) chambers such as DXZ™ chambers, PRODUCER™ chambers, and PRECISION 5000® chambers commercially available from Applied Materials Inc., Santa Clara, Calif.

The process chamber 100 generally houses a support pedestal 150, which is used to support a substrate such as a semiconductor wafer 190. This pedestal 150 can typically be moved in a vertical direction inside the chamber 100 using a displacement mechanism (not shown). Depending on the specific process, the wafer 190 can be heated to some desired temperature prior to layer deposition. For example, the wafer support pedestal 150 is heated by an embedded heater element 170. The pedestal 150 may be resistively heated by applying an electric current from an AC supply 106 to the heater element 170. The wafer 190 is, in turn, heated by the pedestal 150. A temperature sensor 172, such as a thermocouple, is also embedded in the wafer support pedestal 150 to monitor the temperature of the pedestal 150 in a conventional manner. The measured temperature is used in a feedback loop to control the power supply 16 for the heating element 170, such that the wafer temperature can be maintained or controlled at a desired temperature which is suitable for the particular process application. The pedestal 150 is optionally heated using a plasma or by radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 100 are ignited into a plasma. Typically, the electric field is generated by connecting the wafer support pedestal 150 to a source of RF power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

In at least one embodiment, fluoro-organosilicate layer deposition is accomplished by plasma enhanced oxidation of a fluoro-organosilane compound such as fluoromethyl silane. The fluoro-organosilane compound is introduced into the process chamber 100 under the control of gas panel 130 as a gas with a regulated flow.

Proper control and regulation of the gas flows through the gas panel 130 is performed by mass flow controllers (not shown) and a controller unit 110 such as a computer (not shown). The showerhead 120 allows process gases from the gas panel 130 to be uniformly introduced and distributed in the process chamber 100. Illustratively, the control unit 110 comprises a central processing unit (CPU) 113, support circuitry 114, and memories containing associated control software 116. This control unit 110 is responsible for automated control of the numerous steps required for wafer processing—such as wafer transport, gas flow control, temperature control, chamber evacuation, and other steps. Bi-directional communications between the control unit 110 and the various components of the apparatus 10 are handled through numerous signal cables collectively referred to as signal buses 118, some of which are illustrated in FIG. 1A.

The heated pedestal 150 is typically made of aluminum, and comprises a heating element 170 embedded at a distance below the wafer support surface 151 of the pedestal 150. The heating element 170 can be made of a nickel-chromium wire encapsulated in an Incaloy sheath tube. By properly adjusting the current supplied to the heating element 170, the wafer 190 and the pedestal 150 can be maintained at a relatively constant temperature during film deposition. This is accomplished by a feedback control loop, in which the temperature of the pedestal 150 is continuously monitored by a thermocouple 172 embedded in the pedestal 150. This information is transmitted to the control unit 110, via a signal bus 118, which responds by sending the necessary signals to the heater power supply. Adjustment is subsequently made in the current supply 106 to maintain and control pedestal 150 at a desirable temperature (i. e., a temperature that is appropriate for the specific process application). When the process gas mixture exits the showerhead 120, plasma enhanced oxidation of the fluoro-organosilane compound occurs at the surface 191 of the heated wafer 190, resulting in the deposition of a fluoro-organosilicate layer on the wafer 190.

Figure 1B:
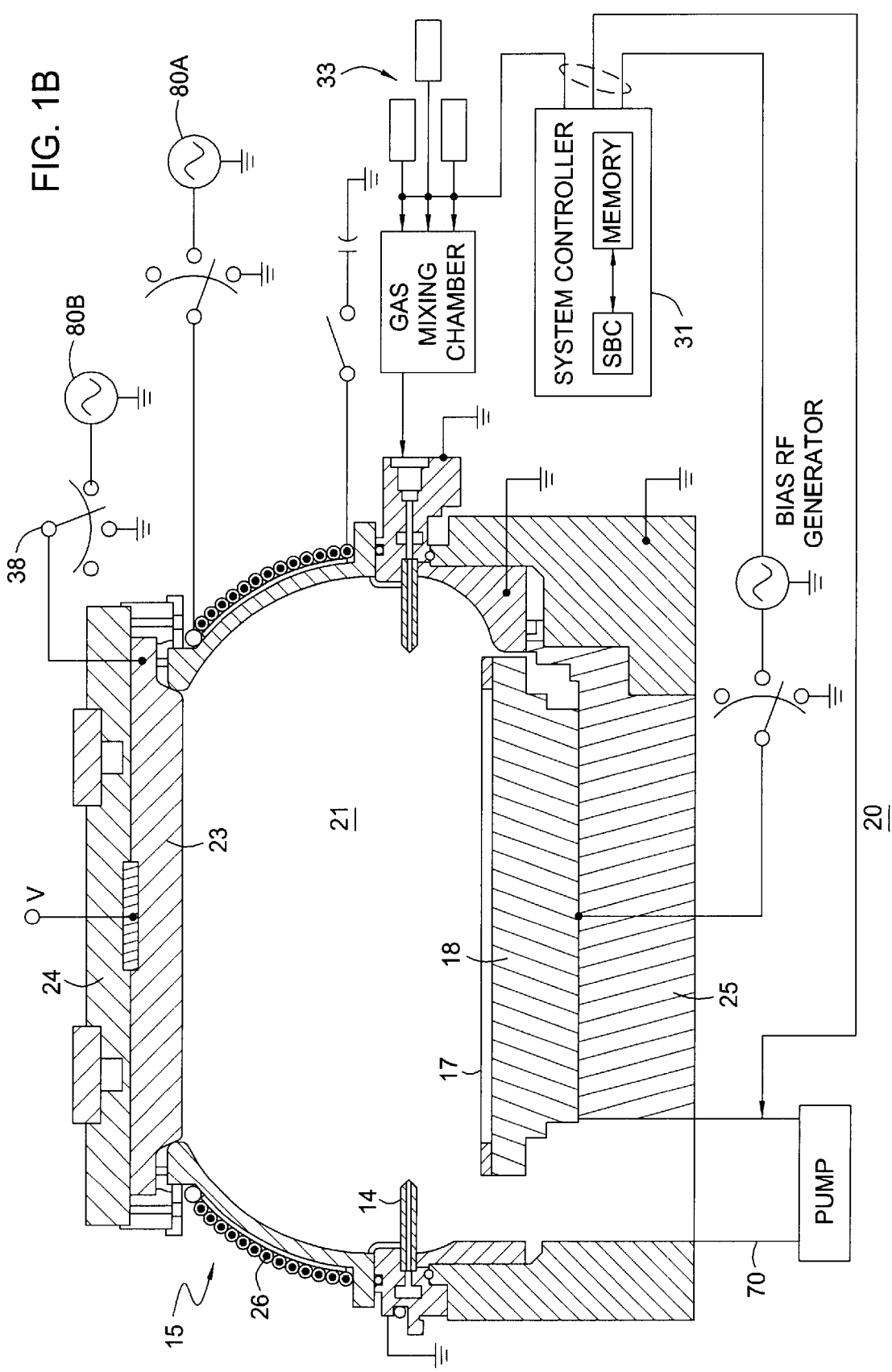

Alternatively, referring to FIG. 1B, a high density plasma chemical vapor deposition (HDP-CVD) system 20 can be used to perform fluoro-organosilicate layer formation in accordance with embodiments described herein. Examples of system 20 include ULTIMA HDP CVD™ chambers commercially available from Applied Materials Inc., Santa Clara, Calif.

System 20 typically includes a chamber 21 a vacuum system 70, a source plasma system (SPS) 80A, a bias plasma system (BPS) 80B, a gas delivery system 33, and a system controller 31.

The upper portion of chamber 21 includes a dome 15, which is made of a ceramic dielectric material, such as aluminum oxide or aluminum nitride. Dome 15 defines an upper boundary of a plasma processing region of the chamber 21. A lower boundary of the plasma processing region is defined by the upper surface of the substrate 17 and a substrate support 18. The substrate support is made of a material such as aluminum oxide or an aluminum ceramic material.

A heater plate 23 and a cold plate 24 surmount, and are thermally coupled to dome 15. Heater plate 23 and cold plate 24 are used to control the dome temperature to within about ±10° C. over a range of about 100° C. to about 200° C. Accurate control of the dome temperature may reduce the flake or particle count in the chamber 21 and improve adhesion between the deposited layer and the substrate.

The lower portion of the chamber 21 includes a body member 25 used to couple the chamber to the vacuum system 70. A base portion of the substrate support 18 is mounted on, and forms a continuous inner surface with, body member 25. Substrates 17 are transferred into and out of chamber 21 by a robot blade (not shown) through an insertion/removal opening (not shown) in the side of chamber 21.

Vacuum system 70 is used to control the chamber pressure in a range of about 1 millitorr (mtorr) to about 2 torr as well as provide a pumping capacity of about 22 liters/minute.

The source plasma system (SPS) 80A includes coils 26 mounted on dome 15. A symmetrical ground shield (not shown) reduces electrical coupling between the coils. When an electric field is generated by these inductively driven coils, the process gases introduced into the chamber 21 are ignited into a plasma. Typically, SBS 80A provides up to about 5,000 watts of radio frequency (RF) power at a frequency between about 1.8 MHz (megahertz) to about 2.2 MHz.

The bias plasma system (BPS) 80B capacitively couples the substrate 17 to body member 18. The BPS 80B enhances the transport of plasma species (e. g., ions) created by the SBS 80A toward the surface of the substrate. Typically, BPS 80B provides up to about 5,000 watts of radio frequency (RF) power at a frequency between about 1 MHz to about 100 MHz.

A gas delivery system 33 provides gases to the chamber 21 via gas ring 14. Gas ring 14 includes a plurality of nozzles (not shown) that provide uniform gas flow to the plasma processing region of the chamber 21 over the substrate 17. Nozzle length and nozzle angle may be varied depending on the particular process.

The system controller 31 may be one of any form of general purpose computer processor that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the substrate support 18. The software routine, when executed, transforms the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

Fluro-Organosilicate Layer Deposition

In one embodiment, the fluoro-organosilicate layer is formed from a gas mixture of a fluoro-organosilane compound and an oxidizing gas. The fluoro-organosilicate layer has the general formula $Si_xO_yC_zF_w$, where x has a range between 17 and 35, y has a range between 38 and 55, z has a range between 3 and 8, and w has a range between 4 and 12.

The fluoro-organosilane compound has the general formula $SiC_aF_bH_c$, where a has a range between 1 and 4, b has a range between 3 and 12, and c has a range between 0 and 3. For example, fluoromethyl silane ($SiCF_3H_3$), difluoromethyl silane ($SiC_2F_6H_2$), trifluoromethyl silane ($SiC_3F_9H$), or combinations thereof, among others may be used as the fluoro-organosilane compound.

Oxygen ($O_2$), nitrous oxide ($N_2O$), carbon monoxide (CO), carbon dioxide ($CO_2$), nitrogen ($N_2$) or combinations thereof, among others, may be used as the oxidizing gas.

In general, the following deposition process parameters can be used to form the fluoro-organosilicate layer using a PECVD or SACVD chamber. The process parameters range from a wafer temperature of about 300° C. to about 450° C., a chamber pressure of about 0.1 torr to about 100 torr, a fluoro-organosilane gas flow rate of about 50 sccm to about 1000 sccm, an oxidizing gas flow rate of about 200 sccm to about 1500 sccm, and an RF power of between about 0.3 W/cm² to about 3 W/cm². The above process parameters provide a deposition rate for the fluoro-organosilicate layer in the range of about 800 Å to about 3000 Å when implemented on a 200 mm (millimeter) substrate in a deposition chamber available from Applied Materials, Inc.

Alternatively, for a HDP CVD chamber the fluoro-organosilicate layer may be formed from a gas mixture of silane ($SiH_4$), disilane ($Si_2H_6$), trisilane ($Si_3H_8$) fluorosilane ($SiF_4$), carbon tetrafluoride ($CF_4$), hexafluoroethane ($C_2F_6$), octofluoropropane ($C_3F_8$), decafluorobutane ($C_4F_{10}$), and combinations thereof reacted with an oxidizing gas. Oxygen ($O_2$), nitrous oxide ($N_2O$), carbon monoxide (CO), carbon dioxide ($CO_2$), nitrogen ($N_2$) or combinations thereof, among others, may be used as the oxidizing gas.

The following deposition process parameters can be used to form the fluoro-organosilicate layer using a HDP CVD chamber. The process parameters range from a wafer temperature of about 300° C. to about 450° C., a chamber pressure of about 1 millitorr to about 10 millitorr, a fluoro-organosilane gas flow rate of about 40 sccm to about 100 sccm, an oxidizing gas flow rate of about 50 sccm to about 300 sccm, and an RF power of between about 4.5 W/cm² to about 25 W/cm². The above process parameters provide a deposition rate for the fluoro-organosilicate layer in the range of about 2500 Å to about 7000 Å when implemented on a 200 mm (millimeter) substrate in a deposition chamber available from Applied Materials, Inc.

Other deposition chambers are within the scope of the invention, and the parameters listed above may vary according to the particular deposition chamber used to form the fluoro-organosilicate layer. For example, other deposition chambers may have a larger or smaller volume, requiring gas flow rates that are larger or smaller than those recited for deposition chambers available from Applied Materials, Inc. and may be configured to accommodate 300 mm substrates.

The as-deposited fluoro-organosilicate layer has a dielectric constant that is less than about 3.5, making it suitable for use as an insulating material in integrated circuits. The dielectric constant of the fluoro-organosilicate layer is tunable, in that it can be varied in a range between about 2.5 to about 3.5 as a function of the reaction temperature. In particular, as the temperature increases the dielectric constant of the as-deposited layer decreases.

The dielectric constant of the fluoro-organosilicate layer can be tuned as a function of the composition of the gas mixture during layer formation. As the fluorine (F) and/or carbon (C) concentration in the gas mixture increases, the F and/or C content of the as-deposited fluoro-organosilicate layer increases, decreasing its dielectric constant. In addition, as the F content of the as-deposited fluoro-organosilicate layer increases the etch rate thereof similarly increases. Also, as the C content of the as-deposited fluoro-organosilicate layer increases the hydrophobic properties thereof increase, making such layer suitable for use as moisture barriers in integrated circuits.

Integrated Circuit Fabrication Processes

A. Fluoro-organosilicate Hardmask

Figure 2A:
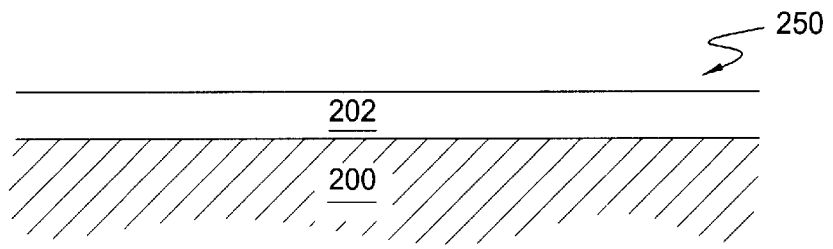
FIGS. 2a–2e depict schematic cross-sectional views of a substrate at different stages of integrated circuit fabrication incorporating a fluoro-organosilicate layer as a hardmask.

FIGS. 2a–e illustrate schematic cross-sectional views of a substrate 200 at different stages of an integrated circuit fabrication sequence incorporating a fluoro-organosilicate layer as a hard mask. In general, the substrate 200 refers to any workpiece on which processing is performed, and a substrate structure 250 is used to generally denote the substrate together with other material layers formed on the substrate 200. Depending on the specific stage of processing, the substrate 200 may correspond to a silicon substrate, or other material layer that has been formed on the substrate. FIG. 2a, for example, illustrates a cross-sectional view of a substrate structure 250, having a material layer 202 that has been conventionally formed thereon. The material layer 202 may be an oxide (e. g., silicon dioxide). In general, the substrate 200 may include a layer of silicon, silicides, metals, or other materials. FIG. 2a illustrates one embodiment in which the substrate 200 is silicon having a silicon dioxide layer formed thereon.

Figure 2B:
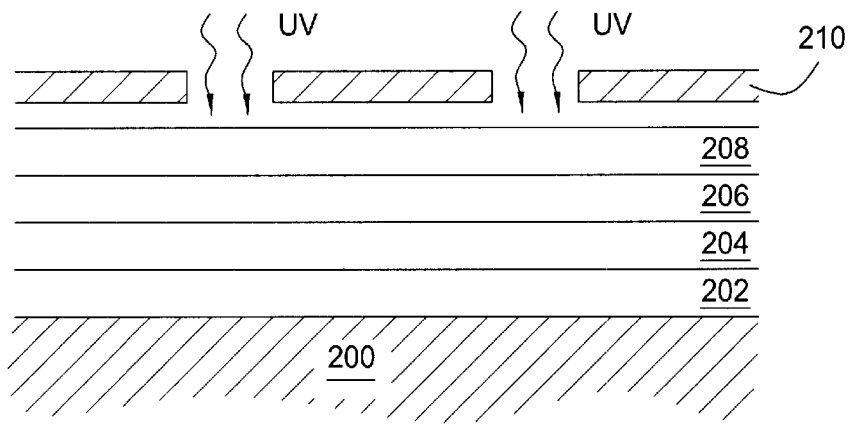

FIG. 2b depicts a fluoro-organosilicate layer 204 deposited on the substrate structure 250 of FIG. 2a. The fluoro-organosilicate layer 204 is formed on the substrate structure 250 according to the process parameters described above. The fluoro-organosilicate layer has a dielectric constant less than about 3.5. The dielectric constant for the fluoro-organosilicate layer is tunable, in that it can be varied in the desired range as a function of the reaction temperature as well as the composition of the gas mixture during layer formation.

The thickness of the fluoro-organosilicate layer is variable depending on the specific stage of processing. Typically, the fluoro-organosilicate layer is deposited to a thickness of about 4,000 Å to about 15,000 Å.

A layer of energy sensitive resist material 208 is formed on the fluoro-organosilicate layer 204. The layer of energy sensitive resist material 208 can be spin coated on the substrate to a thickness within the range of about 4000 Å to about 10,000 Å. Most energy sensitive resist materials are sensitive to ultraviolet (UV) radiation having a wavelength less than about 450 nm.

Dependent on the etch chemistry of the energy sensitive resist material used in the fabrication sequence, an intermediate layer 206 is formed on the fluoro-organosilicate layer 204. When the energy sensitive resist material 208 and the fluoro-organosilicate layer 204 can be etched using the same chemical etchants, the intermediate layer 206 functions as a mask for the fluoro-organosilicate layer 204. The intermediate layer 206 is conventionally formed on the fluoro-organosilicate layer 204. The intermediate layer 206 may be an oxide, nitride, silicon oxynitride, silicon carbide, amorphous silicon, or other suitable material.

Figure 2C:
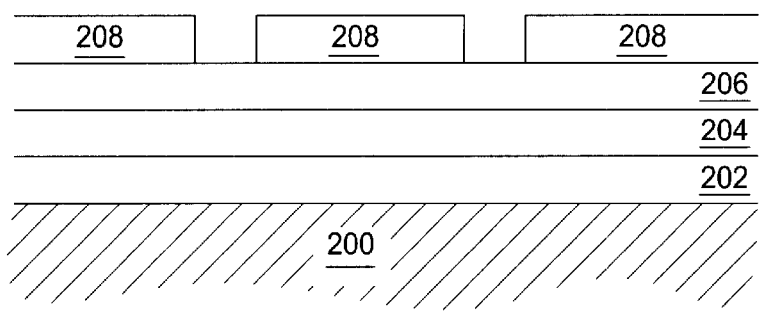
Figure 2D:
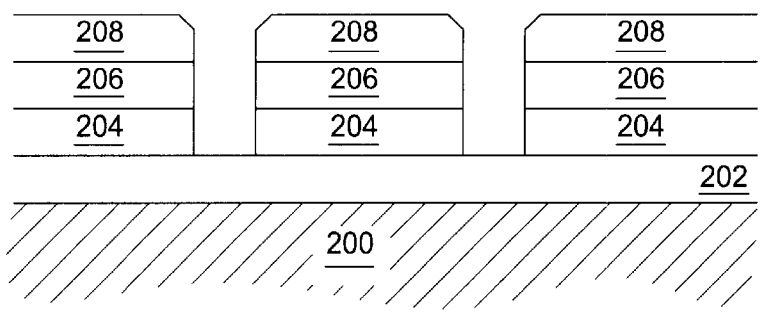

An image of a pattern is introduced into the layer of energy sensitive resist material 208 by exposing such energy sensitive resist material 208 to UV radiation via mask 210. The image of the pattern introduced in the layer of energy sensitive resist material 208 is developed in an appropriate developer to define the pattern through such layer, as shown in FIG. 2c. Thereafter, referring to FIG. 2d, the pattern defined in the energy sensitive resist material 208 is transferred through the fluoro-organosilicate layer 204. The pattern is transferred through the fluoro-organosilicate layer 204 using the energy sensitive resist material 208 as a mask. The pattern is transferred through the fluoro-organosilicate layer 204 using an appropriate chemical etchant. For example, fluorocarbon compounds such as fluoromethane ($CF_4$), fluoroethane ($C_2F_6$), and fluorobutene ($C_4F_8$) may be used to chemically etch the fluoro-organosilicate layer 204.

Alternatively, when the intermediate layer 206 is present, the pattern defined in the energy sensitive resist material 208 is first transferred through the intermediate layer 206 using the energy sensitive resist material 208 as a mask. Thereafter, the pattern is transferred through the fluoro-organosilicate layer 204 using the intermediate layer 206 as a mask. The pattern is transferred through both the intermediate layer 206 as well as the fluoro-organosilicate layer 204 using appropriate chemical etchants.

Figure 2E:
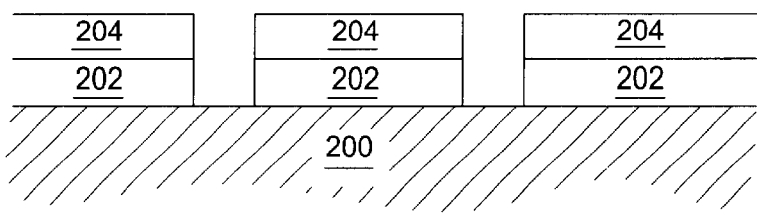

FIG. 2e illustrates the completion of the integrated circuit fabrication sequence by the transfer of the pattern defined in the fluoro-organosilicate layer 204 through the silicon dioxide layer 202 using the fluoro-organosilicate layer as a hardmask.

After the silicon dioxide layer 202 is patterned, the fluoro-organosilicate layer 204 can optionally be stripped from the substrate 200 by etching it in a suitable chemical etchant.

B. Damascene Structure Incorporating a Fluoro-Organosilicate Layer

Figure 3A:
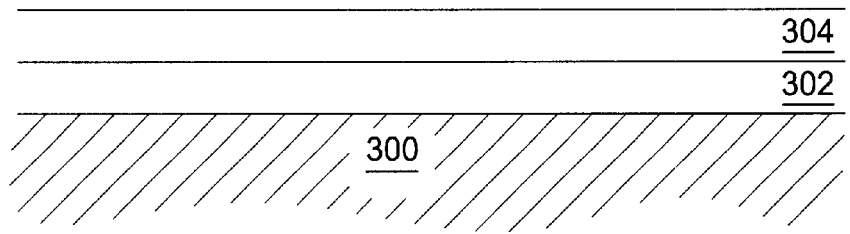
FIGS. 3a–3d depict schematic cross-sectional views of a damascene structure at different stages of integrated circuit fabrication incorporating a fluoro-organosilicate layer in such structure.

FIGS. 3a–3d illustrate schematic cross-sectional views of a substrate 300 at different stages of a damascene structure fabrication sequence incorporating a fluoro-organosilicate layer therein. Damascene structures are typically used to form metal interconnects on integrated circuits. Depending on the specific stage of processing, substrate 300 may correspond to a silicon substrate, or other material layer that has been formed on the substrate 300. FIG. 3a, for example, illustrates a cross-sectional view of a substrate 300 having a first dielectric layer 302 formed thereon. The first dielectric layer 302 may be an oxide (e. g., silicon dioxide, fluorosilicate glass). In general, the substrate 300 may include a layer of silicon, silicides, metals, or other materials.

FIG. 3a illustrates one embodiment in which the substrate 300 is silicon having a fluorosilicate glass layer formed thereon. The first dielectric layer 302 has a thickness of about 5,000 Å to about 10,000 Å, depending on the size of the structure to be fabricated.

A fluoro-organosilicate layer 304 is formed on the first dielectric layer 302. The fluoro-organosilicate layer 304 is formed on the first dielectric layer 302 according to the process parameters described above. The fluoro-organosilicate layer 304 has a dielectric constant less than about 3.5, so as to prevent or minimize capacitive coupling between the metal interconnects to be formed in the damascene structure. The dielectric constant for the fluoro-organosilicate layer is tunable, in that it can be varied in the desired range as a function of the reaction temperature as well as the composition of the gas mixture during layer formation.

The thickness of the fluoro-organosilicate layer 304 is variable depending on the specific stage of processing. Typically, the fluoro-organosilicate layer 304 has a thickness of about 200 Å to about 1000 Å.

Figure 3B:
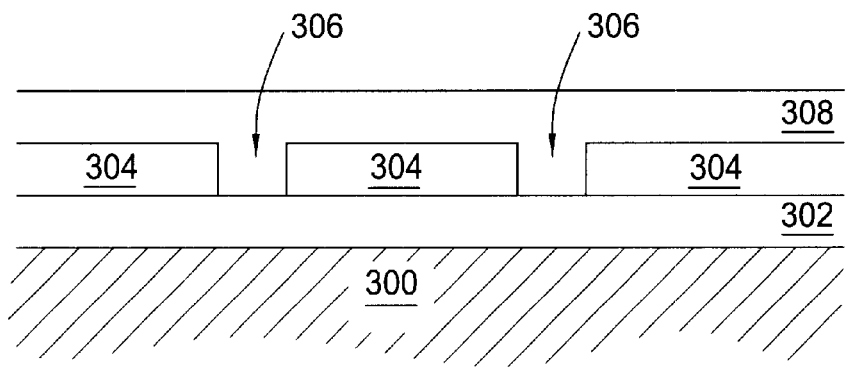

Referring to FIG. 3b, the fluoro-organosilicate layer 304 is patterned and etched to define contact/via openings 306 and to expose the first dielectric layer 302, in areas where the contacts/vias are to be formed. The fluoro-organosilicate layer 304 is patterned using conventional lithography and etched using fluorocarbon compounds such as fluoromethane ($CF_4$), fluoroethane ($C_2F_6$), and fluorobutene ($C_4F_8$). After the fluoro-organosilicate layer 304 is patterned, a second dielectric layer 308 is deposited over the fluoro-organosilicate layer 304. The second dielectric layer 308 may be an oxide (e. g., silicon dioxide, fluorosilicate glass). The second dielectric layer 308 has a thickness of about 5,000 Å to about 10,000 Å.

Figure 3C:
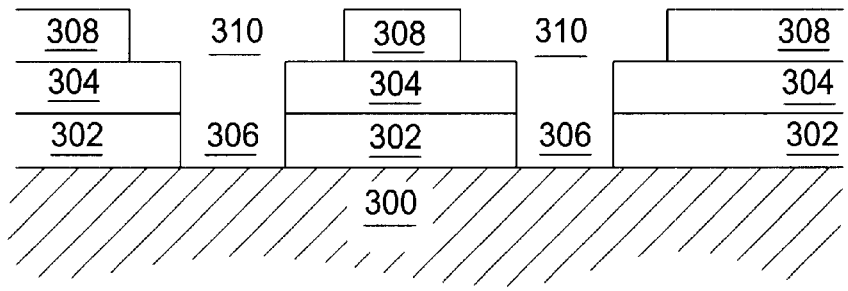
Figure 3D:
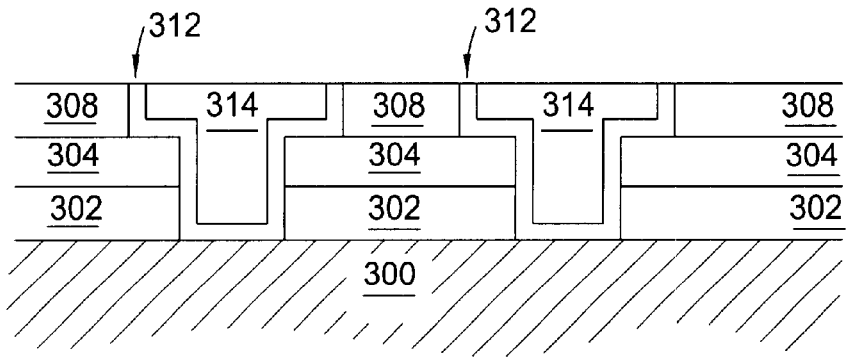

The second dielectric layer 308 is then patterned to define interconnect lines 310, as illustrated in FIG. 3c, preferably using conventional lithography processes. The interconnects 310 formed in the second dielectric layer 308 are positioned over the contact/via openings 306 in the fluoro-organosilicate layer 304. Thereafter, both the interconnects 310 and contacts/vias 306 are etched using reactive ion etching or other anisotropic etching techniques.

The interconnects 310 and contacts/vias 306 are filled with a conductive material 314 such as aluminum, copper, tungsten, or combinations thereof. Typically, copper is used to fill the interconnects 310 and contacts/vias 306 due to its low resistivity (resistivity about 1.7 μΩ-cm). The conductive material 314 is deposited using chemical vapor deposition, physical vapor deposition, electroplating, or combinations thereof, to form the damascene structure. Preferably, a barrier layer 316 such as tantalum, tantalum nitride, or other suitable barrier material is first deposited conformably on the sidewalls of the interconnects 310 and contacts/vias 306 to prevent metal migration into the surrounding dielectric layers 302, 308 as well as the fluoro-organosilicate layer 304.

Although several preferred embodiments, which incorporate the teachings of the present invention, have been shown and described in detail, those skilled in the art can readily devise many other varied embodiments that still incorporate these teachings.

What is claimed is:

1. A method of forming a fluoro-organosilicate layer on a substrate, comprising:

positioning a substrate in a deposition chamber;

providing a gas mixture to the deposition chamber, wherein the gas mixture comprises a fluoro-organosilane compound and an oxidizing gas; and applying an electric field to the gas mixture in the deposition chamber to form a fluoro-organosilicate layer on the substrate, wherein the fluoro-organosilicate layer has the general formula $Si_xO_yC_zF_w$, where x has a range between 17 and 35, y has a range between 38 and 55, z has a range between 3 and 8, and w has a range between 4 and 12.

2. The method of claim 1 wherein the fluoro-organosilane compound has the general formula $SiC_aF_bH_c$, where a has a range between 1 and 4, b has a range between 3 and 12, and c has a range between 0 and 3.

3. The method of claim 2 wherein the fluoro-organosilane compound is selected from the group of fluoromethyl silane ($SiCF_3H_3$), difluoromethyl silane ($SiC_2F_6H_2$), trifluoromethyl silane ($SiC_3F_9H$), tetrafluoromethyl silane ($SiC_4F_{12}$), and combinations thereof.

4. The method of claim 1 wherein the oxidizing gas is selected from the group of nitrous oxide ($N_2O$), oxygen ($O_2$), carbon monoxide (CO), carbon dioxide ($CO_2$), nitrogen ($N_2$) and combinations thereof.

5. The method of claim 1 wherein the electric field applied to the gas mixture in the deposition chamber is a radio frequency (RF) power.

6. The method of claim 5 wherein the RF power is within the range of about 0.3 W/cm$^2$ to about 25 W/cm$^2$.

7. The method of claim 1 wherein the deposition chamber is maintained at a pressure between about 0.1 millitorr to about 100 torr.

8. The method of claim 1 wherein the fluoro-organosilane compound is provided to the deposition chamber at a flow rate in a range of about 40 sccm to about 1000 sccm.

9. The method of claim 1 wherein the oxidizing gas is provided to the deposition chamber at a flow rate in a range of about 50 sccm to about 1500 sccm.

10. The method of claim 1 wherein the deposition chamber is maintained at a temperature between about 300° C. to about 450° C.

11. The method of claim 1 wherein the fluoro-organosilicate layer formed on the substrate has a dielectric constant less than about 3.5.

12. A method of fabricating a device, comprising:

forming a fluoro-organosilicate layer on a substrate by a method comprising:

positioning a substrate in a deposition chamber;

providing a gas mixture to the deposition chamber, wherein the gas mixture comprises a fluoro-organosilane compound and an oxidizing gas; and applying an electric field to the gas mixture in the deposition chamber to form a fluoro-organosilicate layer on the substrate, wherein the fluoro-organosilicate layer has the general formula $Si_xO_yC_zF_w$, where x has a range between 17 and 35, y has a range between 38 and 55, z has a range between 3 and 8, and w has a range between 4 and 12;

defining a pattern in at least one region of the fluoro-organosilicate layer; and transferring the pattern defined in the at least one region of the fluoro-organosilicate layer into the substrate using the fluoro-organosilicate layer as a mask.

13. The method of claim 12 further comprising removing the fluoro-organosilicate layer from the substrate.

14. The method of claim 12 wherein the substrate has one or more material layers formed thereon.

15. The method of claim 12 wherein definition of the pattern in the at least one region of the fluoro-organosilicate layer, comprises:

forming a layer of energy sensitive resist material on the fluoro-organosilicate layer;

introducing an image of the pattern into the layer of energy sensitive resist material by exposing it to patterned radiation;

developing the image of the pattern introduced into the layer of energy sensitive resist material; and transferring the pattern developed in the layer of energy sensitive resist material through the fluoro-organosilicate layer using the layer of energy sensitive resist material as a mask.

16. The method of claim 13 wherein the fluoro-organosilicate layer is removed from the substrate using fluorocarbon compounds such as fluoromethane ($CF_4$), fluoroethane ($C_2F_6$), and fluorobutene ($C_4F_8$).

17. The method of claim 12 wherein the fluoro-organosilane compound has the general formula $SiC_aF_bH_c$, where a has a range between 1 and 4, b has a range between 3 and 13, and c has a range between 0 and 3.

18. The method of claim 17 wherein the fluoro-organosilane compound is selected from the group of fluoromethyl silane ($SiCF_3H_3$), difluoromethyl silane ($SiC_2F_6H_2$), trifluoromethyl silane ($SiC_3F_9H$), tetrafluoromethyl silane ($SiC_4F_{12}$), and combinations thereof.

19. The method of claim 12 wherein the oxidizing gas is selected from the group of nitrous oxide ($N_2O$), oxygen ($O_2$), carbon monoxide (CO), carbon dioxide ($CO_2$), nitrogen ($N_2$), and combinations thereof.

20. The method of claim 12 wherein the electric field applied to the gas mixture in the deposition chamber is a radio frequency (RF) power.

21. The method of claim 20 wherein the RF power is within the range of about 0.3 W/cm$^2$ to about 25 W/cm$^2$.

22. The method of claim 12 wherein the deposition chamber is maintained at a pressure between 0.1 millitorr to about 100 torr.

23. The method of claim 12 wherein the fluoro-organosilane compound is provided to the deposition chamber at a flow rate in a range of about 40 sccm to about 1000 sccm.

24. The method of claim 12 wherein the oxidizing gas is provided to the deposition chamber at a flow rate in a range of about 50 sccm to about 1500 sccm.

25. The method of claim 12 wherein the deposition chamber is maintained at a temperature between about 300° C. to about 450° C.

26. The method of claim 12 wherein the fluoro-organosilicate layer formed on the substrate has a dielectric constant less than about 3.5.

27. A method of fabricating a damascene structure, comprising forming a first dielectric layer on a substrate;

forming a fluoro-organosilicate layer on the first dielectric layer by a method comprising:
  positioning a substrate in a deposition chamber;
  providing a gas mixture to the deposition chamber, wherein the gas mixture comprises a fluoro-organosilane compound and an oxidizing gas; and
  applying an electric field to the gas mixture in the deposition chamber to form a fluoro-organosilicate layer on the substrate, wherein the fluoro-organosilicate layer has the general formula $Si_xO_yC_zF_w$, where x has a range between 17 and 35, y has a range between 38 and 55, z has a range between 3 and 8, and w has a range between 4 and 12;

patterning the fluoro-organosilicate layer to define contacts/vias therethrough;

forming a second dielectric layer on the patterned fluoro-organosilicate layer;

patterning the second dielectric layer to define interconnects therethrough, wherein the interconnects are positioned over the contacts/vias defined in the fluoro-organosilicate layer;

etching the first dielectric layer to form contacts/vias therethrough; and filling the contacts/vias and the interconnects with a conductive material.

28. The method of claim 27 wherein the first dielectric layer and the second dielectric layer are each selected from the group consisting of amorphous carbon, fluorinated amorphous carbon, parylene, fluorinated silicate glass (FSG), $AF_4$, BCB, silicon carbide, oxynitride, and combinations thereof.

29. The method of claim 27 wherein the conductive material filling the contacts/vias and interconnects is selected from the group consisting of copper, aluminum, tungsten, and combinations thereof.

30. The method of claim 27 wherein the fluoro-organosilane compound has the general formula $SiC_aF_bH_c$, where a has a range between 1 and 4, b has a range between 3 and 12, and c has a range between 0 and 3.

31. The method of claim 30 wherein the fluoro-organosilane compound is selected from the group of fluoromethyl silane ($SiCF_3H_3$), difluoromethyl silane ($SiC_2F_6H_2$), trifluoromethyl silane ($SiC_3F_9H$), tetrafluoromethyl silane ($SiC_4F_{12}$), and combinations thereof.

32. The method of claim 27 wherein the oxidizing gas is selected from the group consisting of nitrous oxide ($N_2O$), oxygen ($O_2$), carbon monoxide (CO), carbon dioxide ($CO_2$), nitrogen ($N_2$), and combinations thereof.

33. The method of claim 27 wherein the electric field applied to the gas mixture in the deposition chamber is a radio frequency (RF) power.

34. The method of claim 33 wherein the RF power is within the range of about 0.3 W/cm$^2$ to about 25 W/cm$^2$.

35. The method of claim 27 wherein the fluoro-organosilane compound is provided to the deposition chamber at a flow rate in a range of about 40 sccm to about 1000 sccm.

36. The method of claim 27 wherein the oxidizing gas is provided to the deposition chamber at a flow rate in a range of about 50 sccm to about 1500 sccm.

37. The method of claim 27 wherein the deposition chamber is maintained at a pressure between about 0.1 millitorr to about 100 torr.

38. The method of claim 27 wherein the deposition chamber is maintained at a temperature between about 300° C. to about 450° C.

39. The method of claim 27 wherein the fluoro-organosilicate layer formed on the first dielectric layer has a dielectric constant less than about 3.5.

* * * * *

UNITED STATES PATENT AND TRADEMARK OFFICE
CERTIFICATE OF CORRECTION

PATENT NO. : 6,521,546 B1
DATED : February 18, 2003
INVENTOR(S) : Michael Barnes et al.

It is certified that error appears in the above-identified patent and that said Letters Patent is hereby corrected as shown below:

Column 2,
Line 62, please delete "application Ser."
Line 62, please change "09/211,998" to -- 6,364,954 --.
Line 63, please change "filed" to -- issued --.
Line 64, please change "Dec. 14, 1998" to -- Apr. 2, 2002 --.

Column 5,
Line 43, please change "Fluro-Organosilicate" to -- Fluoro-Organosilicate --.

Signed and Sealed this

Twelfth Day of August, 2003

JAMES E. ROGAN
*Director of the United States Patent and Trademark Office*